(12) United States Patent
Taniuchi

(10) Patent No.: US 7,161,519 B2
(45) Date of Patent: Jan. 9, 2007

(54) PWM MODULATION CIRCUIT AND CLASS D AMPLIFIER USING SUCH PWM MODULATION CIRCUIT

(75) Inventor: Hideo Taniuchi, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/215,008

(22) Filed: Aug. 31, 2005

(65) Prior Publication Data

US 2006/0044168 A1    Mar. 2, 2006

(30) Foreign Application Priority Data

Aug. 31, 2004   (JP)   ............. P2004-251527

(51) Int. Cl.
    *H03M 1/82*    (2006.01)
(52) U.S. Cl. ................. 341/152; 330/10; 330/251
(58) Field of Classification Search ........... 341/152, 341/169–170
    See application file for complete search history.

(56) References Cited

U.S. PATENT DOCUMENTS

| | | | | |
|---|---|---|---|---|
| 4,415,863 | A * | 11/1983 | Tokumo | 330/10 |
| 4,739,304 | A * | 4/1988 | Takeda et al. | 341/156 |
| 6,188,261 | B1 * | 2/2001 | Nosaka et al. | 327/261 |
| 6,208,280 | B1 * | 3/2001 | Baker et al. | 341/152 |
| 6,542,097 | B1 * | 4/2003 | Tafuru | 341/143 |
| 6,563,376 | B1 * | 5/2003 | Fujisawa | 330/10 |
| 6,614,297 | B1 | 7/2003 | Score et al. | |

* cited by examiner

*Primary Examiner*—Rexford Barnie
*Assistant Examiner*—Nguyen Khai
(74) *Attorney, Agent, or Firm*—McDermott Will & Emery LLP

(57) ABSTRACT

The PWM modulation circuit according to the invention is connected to an input terminal for an analog baseband signal and a staircase generating circuit generating a staircase wave, and carries out PWM modulation to a staircase wave input from the staircase generating circuit based on an analog baseband signal input from the input terminal. The staircase generating circuit includes a plurality of constant current source circuits, a plurality of switches connected to the plurality of constant current source circuits on a one-to-one basis, a serial-parallel conversion circuit that carries out serial-parallel conversion to a clock signal input from a clock signal input terminal and outputs the result to the plurality of switches, and an output voltage control circuit that converts a constant current input from the plurality of constant current source circuits into a constant voltage at an arbitrary value and outputs the result. The plurality of switches switch between their on and off states in response to a clock signal input from the serial-parallel conversion circuit. The output voltage control circuit converts a constant current input from the plurality of constant current source circuits connected to the plurality of switches in an on state into a constant voltage in a prescribed ratio, so that a staircase wave is generated.

4 Claims, 12 Drawing Sheets

WAVEFORM OF 1:√2 STAIRCASE

FREQUENCY SPECTRUM OF 1:√2 STAIRCASE

WAVEFORM OF 1:√2 STAIRCASE (WITH DELAYED RISING)

FREQUENCY SPECTRUM OF 1:√2 STAIRCASE (WITH DELAYED RISING)

WAVEFORM OF 1:√1.9 STAIRCASE

FREQUENCY SPECTRUM OF 1:√1.9 STAIRCASE

WAVEFORM OF 3-STEP STAIRCASE

FREQUENCY SPECTRUM OF 3-STEP STAIRCASE

FIG. 13 (a) PRIOR ART
WAVEFORM OF RECTANGULAR WAVE
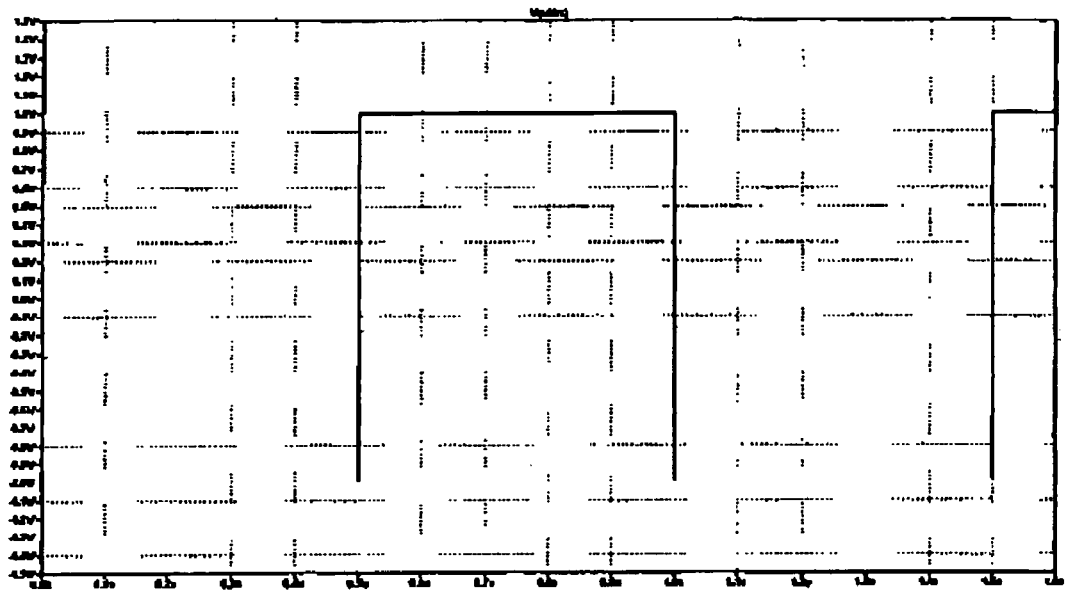
FIG. 13 (b) PRIOR ART
FREQUENCY SPECTRUM OF RECTANGULAR WAVE
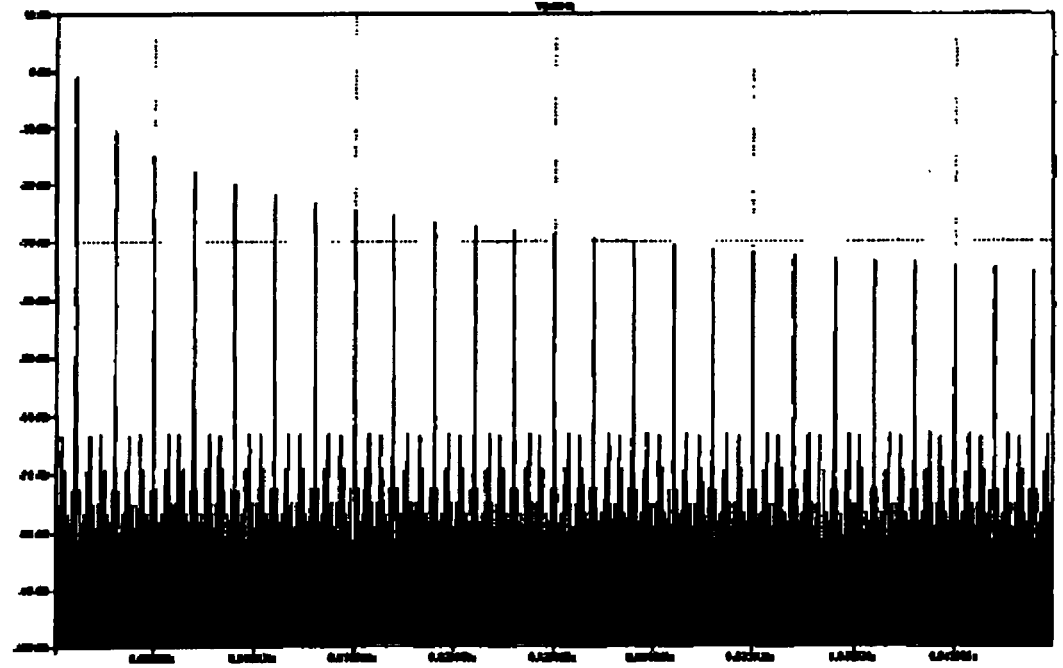

PWM MODULATION CIRCUIT AND CLASS D AMPLIFIER USING SUCH PWM MODULATION CIRCUIT

BACKGROUND OF THE INVENTION

1. Field of the Invention

The present invention relates to a PWM modulation circuit using staircase waves for use in mobile equipment or the like and a class D amplifier using such a PWM modulation circuit.

2. Description of the Related Art

In recent years, there has been a demand for compact and efficient amplifiers, and amplifiers having so-called class D amplifiers have widely been used.

FIG. 11 is a block diagram of the configuration of a conventional class D amplifier. The conventional class D amplifier includes an analog signal input terminal 101, a rectangular wave input terminal 102, a PWM modulation circuit 103, an output stage amplifier 104, an L/C filter 105 including an inductor L108 and a capacitor C109, a speaker 106, and a modulated wave output terminal 107.

In the class D amplifier, the PWM modulation circuit 103 modulates an analog signal input from the analog signal input terminal 101 with a rectangular signal input from the rectangular wave input terminal 102 for conversion into a digital signal. The output stage amplifier 104 then amplifies the modulation signal modulated by the PWM modulation circuit 103 and outputs the result to the L/C filter 105 connected to the output stage. The L/C filter 105 and the speaker 106 then return the modulation wave signals amplified by the output state amplifier 104 into an analog signal based on the LPF characteristic. This is how amplification is carried out.

The conventional class D amplifier having the above-described configuration can amplify a digital signal based on the amplitude of the digital signal, in other words, based only on the ON/OFF states of the signal, so that high power efficiency can be achieved.

Another disclosed example of the conventional class D amplifier employs a ternary scheme for differential output voltage signals and the differential outputs in a silent state are in phase, so that no current is passed to the speaker output. In this way, an amplifier removed of an L/C filter is provided (see for example U.S. Pat. No. 6,614,297).

However, the conventional class D amplifier as shown in FIG. 11 uses a rectangular wave for generating a PWM modulated wave, and therefore the ratio of the high frequency component is large as can be seen from the frequency component characteristic of the rectangular wave in the conventional example in FIG. 12. The constant of the L/C filter 105 must be large in order to remove the high frequency component, which can increase the area necessary for packaging the class D amplifier.

According to the disclosure of U.S. Pat. No. 6,614,297, differential outputs are necessary and therefore an additional output terminal for the purpose is necessary. This can also give rise to unwanted increase in the packaging area of the class D amplifier. Furthermore, the disclosed technique cannot be applied with a single-phase output.

SUMMARY OF THE INVENTION

The present invention is directed to a solution to the above described disadvantages, and it is an object of the present invention to provide a PWM modulation circuit that allows the packaging area of a class D amplifier to be prevented from increasing and a class D amplifier having such a PWM modulation circuit.

A PWM modulation circuit according to the invention is connected to an input terminal for an analog baseband signal, and a staircase generating circuit that generates a staircase wave and carries out PWM modulation to a staircase wave input from the staircase generating circuit based on an analog baseband signal input from the input terminal. The staircase generating circuit includes a plurality of constant current source circuits, a plurality of switches connected to the plurality of constant current source circuits on a one-to-one basis, a serial-parallel conversion circuit that carries out serial-parallel conversion to a clock signal input from a clock signal input terminal and outputs the result to the plurality of switches, and an output voltage control circuit that converts a constant current input from the plurality of constant current source circuits into a constant voltage at an arbitrary value and outputs the result. The plurality of switches switch between their on and off states in response to a clock signal input from the serial-parallel conversion circuit. The output voltage control circuit converts a constant current input from the plurality of constant current source circuits connected to the plurality of switches in an on state into a constant voltage in a prescribed ratio, so that a staircase wave is generated.

In this way, a staircase wave having a reduced high frequency component can be generated and input to the staircase signal input terminal in the PWM modulation circuit. Therefore, PWM modulation can be carried out to a staircase wave having a small high frequency component.

A PWM modulation circuit according to the invention is connected to an input terminal for an analog baseband signal, and a staircase generating circuit that generates a staircase wave. The modulation circuit carries out PWM modulation to a staircase wave input from the staircase generating circuit based on an analog baseband signal input from the input terminal. The staircase generating circuit includes a plurality of constant voltage source circuits, a plurality of switches connected to the plurality of constant voltage source circuits on a one-to-one basis, and a serial-parallel conversion circuit that carries out serial-parallel conversion to a clock signal input from a clock signal input terminal and outputs the result to the plurality of switches. The plurality of switches switch between their on and off states in response to a clock signal input from the serial-parallel conversion circuit. The plurality of constant voltage source circuits connected to the plurality of switches in an on state output a constant voltage in a prescribed ratio, so that a staircase wave is generated.

In this way, using the constant voltage source circuits, PWM modulation can be carried out to a staircase wave having a small high frequency component similarly to the use of the constant current source circuits.

In the PWM modulation circuit according to the invention, the plurality of constant voltage source circuits include a DC-DC converter circuit that can output voltages at a plurality of different voltage values in response to the on/off states of the plurality of switches, and a voltage control circuit that arbitrarily sets the plurality of voltage values. The staircase generating circuit may be a circuit in which the DC-DC converter circuit outputs a plurality of voltages based on a voltage value in a prescribed ratio set by the voltage control circuit in order to generate a staircase wave.

In this way, using a DC-DC converter circuit whose voltage values can be set, PWM modulation can be carried out to a staircase wave having a small high frequency component similarly to the use of the constant current source circuits.

In the PWM modulation circuit according to invention, the serial-parallel conversion circuit includes a frequency-dividing circuit that frequency-divides a clock signal input from the clock signal input terminal and outputs the result, and a plurality of delay circuits having different delay amounts that delay a signal input from the frequency dividing circuit and output the result. The plurality of switches are connected to the plurality of delay circuits on a one-to-one basis.

In this way, a clock signal can be input while the plurality of switches have time delays, so that once one of the switches is switched to an on state, the other switches can be all turned off without a clock signal input in different timings among the plurality of switches.

In the PWM modulation circuit according to invention, as the prescribed ratio, the amplitude ratio of the staircase wave generated by the staircase generating circuit is 1: $\sqrt{2}$ or a value close to the ratio.

In this way, the high frequency component can sufficiently be reduced.

A class D amplifier according to the invention includes the PWM modulation circuit according to the invention, an output stage amplifier that amplifies a PWM modulation signal input from the PWM modulation circuit and outputs the result, and a speaker that outputs the signal input from the output stage amplifier as an audio sound signal.

In this way, a staircase wave having a reduced high freuqency component is generated, the generated wave is input to the staircase wave input terminal in the PWM modulation circuit, PWM modulation can be carried out to the staircase wave having a small high frequency component, the output stage amplifier amplifies the modulated signal, and the original audio sound signal with a reduced high frequency component can be restored and output from the speaker. Consequently, an L/C filter is not necessary, and the packaging area of the class D amplifier can be prevented from increasing.

Using a PWM modulation circuit according to the invention and a class D amplifier using the PWM modulation circuit, the packaging area of the class D amplifier can be prevented from increasing.

BRIEF DESCRIPTION OF THE DRAWINGS

FIG. 13 shows a simulation result for a rectangular wave for use as a conventional PWM modulation wave.

DETAILED DESCRIPTION OF THE PREFERRED EMBODIMENTS

Now, a class D amplifier according to embodiments of the invention will be described in detail in connection with the accompanying drawings.

First Embodiment

Figure 1:
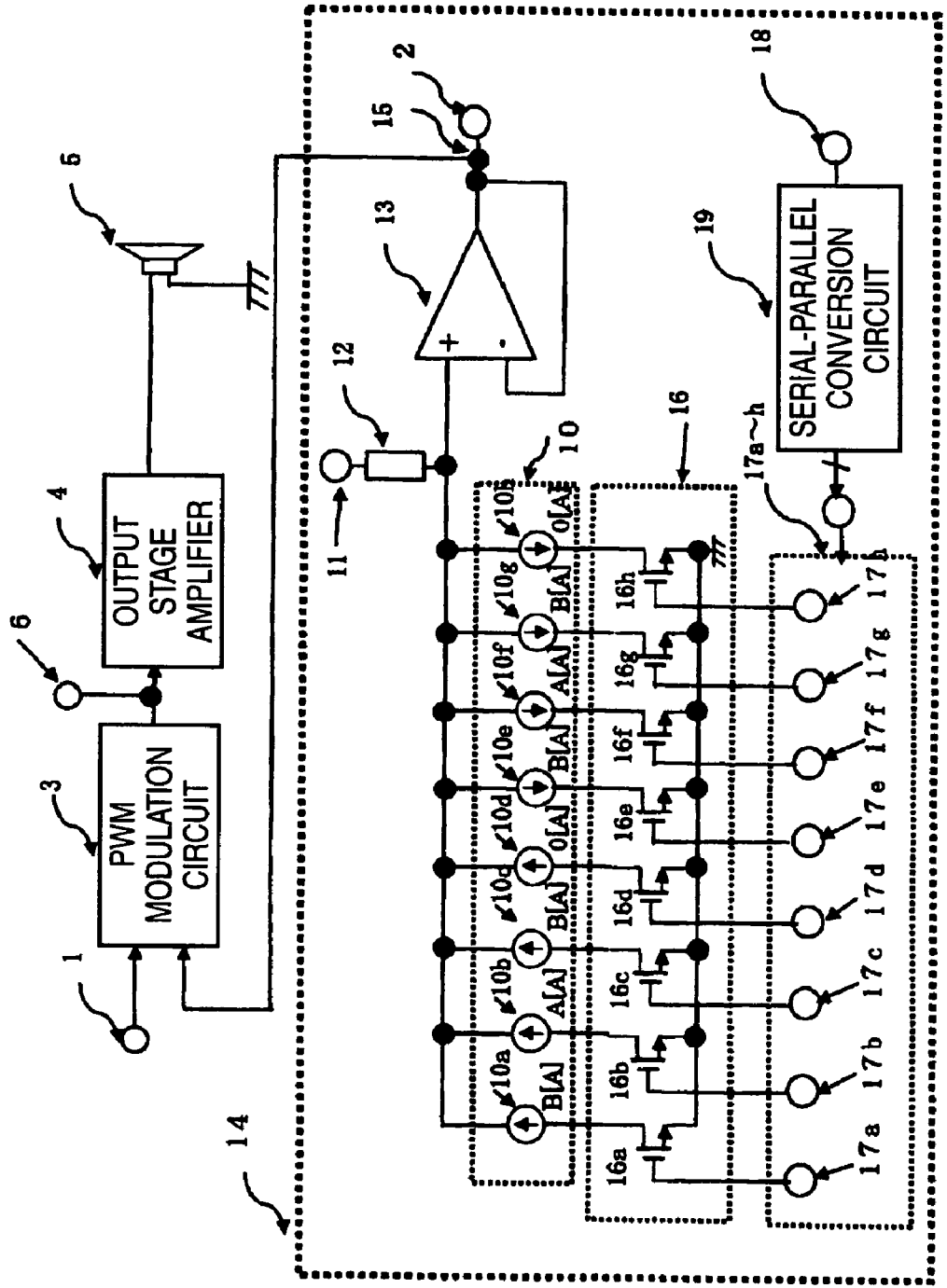
FIG. 1 is a block diagram of the configuration a class D amplifier having a PWM modulation circuit according to a first embodiment of the invention.

FIG. 1 is a block diagram of the configuration of a class D amplifier using a PWM modulation circuit according to a first embodiment of the invention. The class D amplifier having the PWM modulation circuit according to the first embodiment includes an analog baseband signal input terminal 1 to which an analog baseband signal is input, a staircase signal input terminal 2 to which a staircase signal is input, a PWM modulation circuit 3 that modulates an analog baseband signal input from the analog baseband signal input terminal 1 with the staircase signal input from the staircase signal input terminal 2 for conversion into a digital signal, an output stage amplifier 4 that is a class D amplifier amplifying a modulated signal, a speaker 5, a modulated wave output terminal 6 that outputs a modulated wave, and a staircase signal generating circuit 14 that generates a staircase signal to be input to the staircase signal input terminal 2.

The staircase signal generating circuit 14 includes eight constant current source circuits 10, a current source switch circuit 16, an input terminal 17 for the current source switch circuit 16, a clock signal input terminal 18 for a clock signal to cause the switch of the current source switch circuit 16 to turn on/off, a serial-parallel conversion circuit 19 that carries out serial-parallel conversion to the clock signal, an output voltage control resistor 12 that converts a constant current according to the clock signal into a constant voltage, a reference voltage terminal 11, a voltage follower circuit 13, and a staircase signal output terminal 15. The staircase signal output terminal 15 is connected to the staircase signal input terminal 2. The value of the constant current is set among 0, ±$\sqrt{2}$ and ±1.

Figure 2:
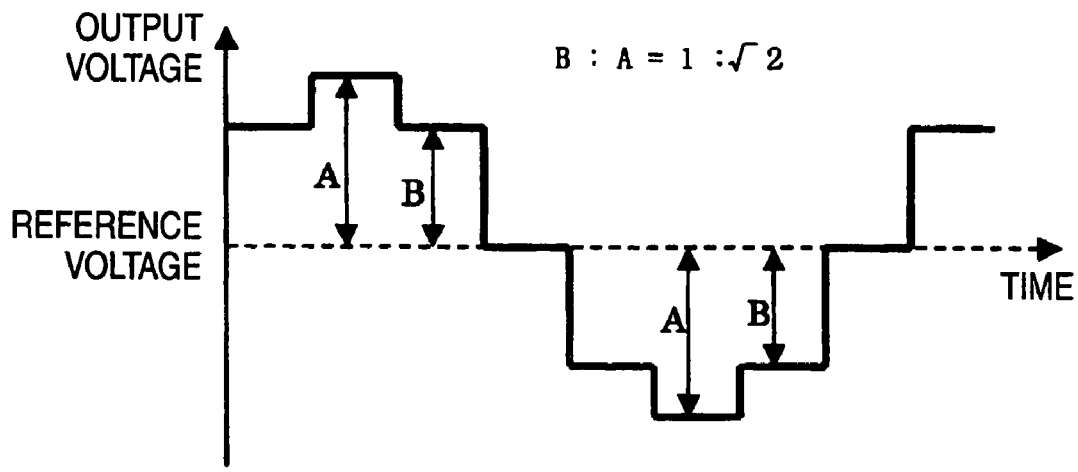
FIG. 2A is a chart showing the voltage waveform of a staircase wave generated in a staircase generating circuit according to the first embodiment.
FIG. 2B is a chart showing the waveform of a clock signal that controls a current source switch circuit in the staircase generating circuit according to the first embodiment.
Figure 2:
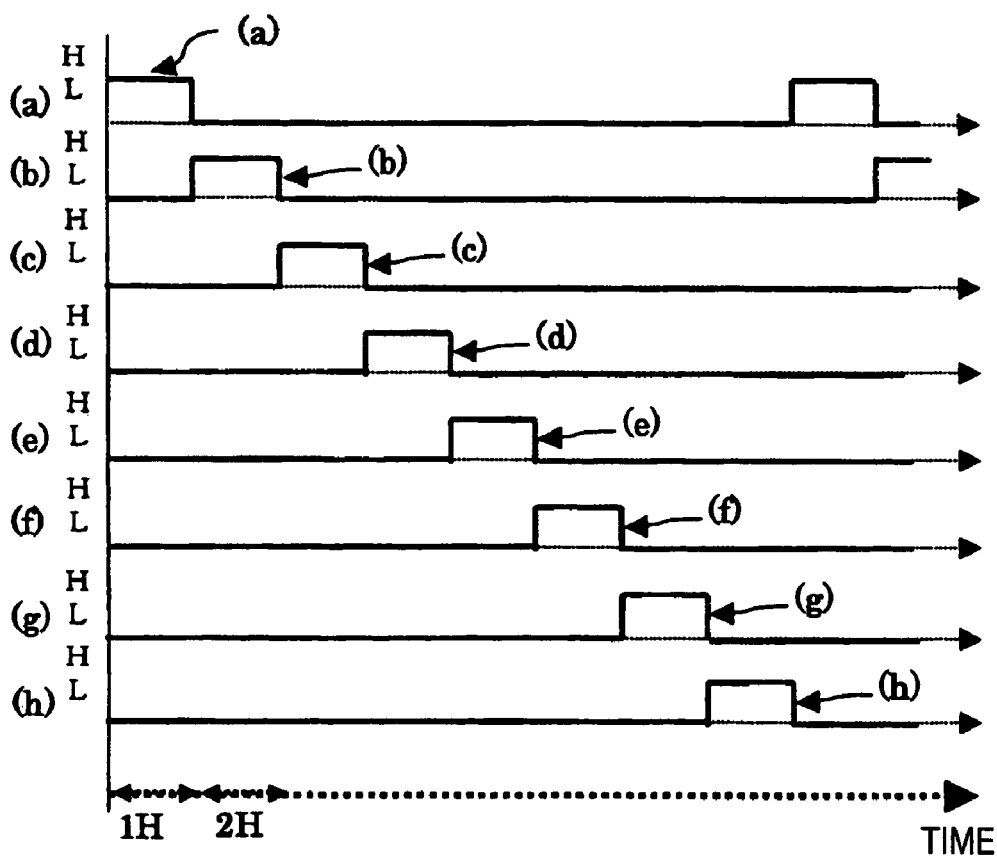

Now, the staircase signal generating circuit 14 having the above described configuration will be described in conjunction with FIGS. 2 and 3.

FIGS. 2A and 2B are charts showing waveforms in the staircase generating circuit according to the first embodiment. FIG. 2B is a waveform chart for the clock signal that controls the current source switch circuit 16, and the signal waveforms a to h correspond to the input terminals 17a to 17h of the current source switches, respectively in the current source switch circuit 16. When any of the waveforms shown in FIG. 2B is at an H level, the current source switch corresponding to the waveform is on, and when it is at an L level, the corresponding current source switch is off. For example, in FIG. 2B, at time 1H, only the current source switch 16a corresponding to the waveform (a) is in an on state, while the other current source switches 16b to 16h are in an off state.

Figure 3:
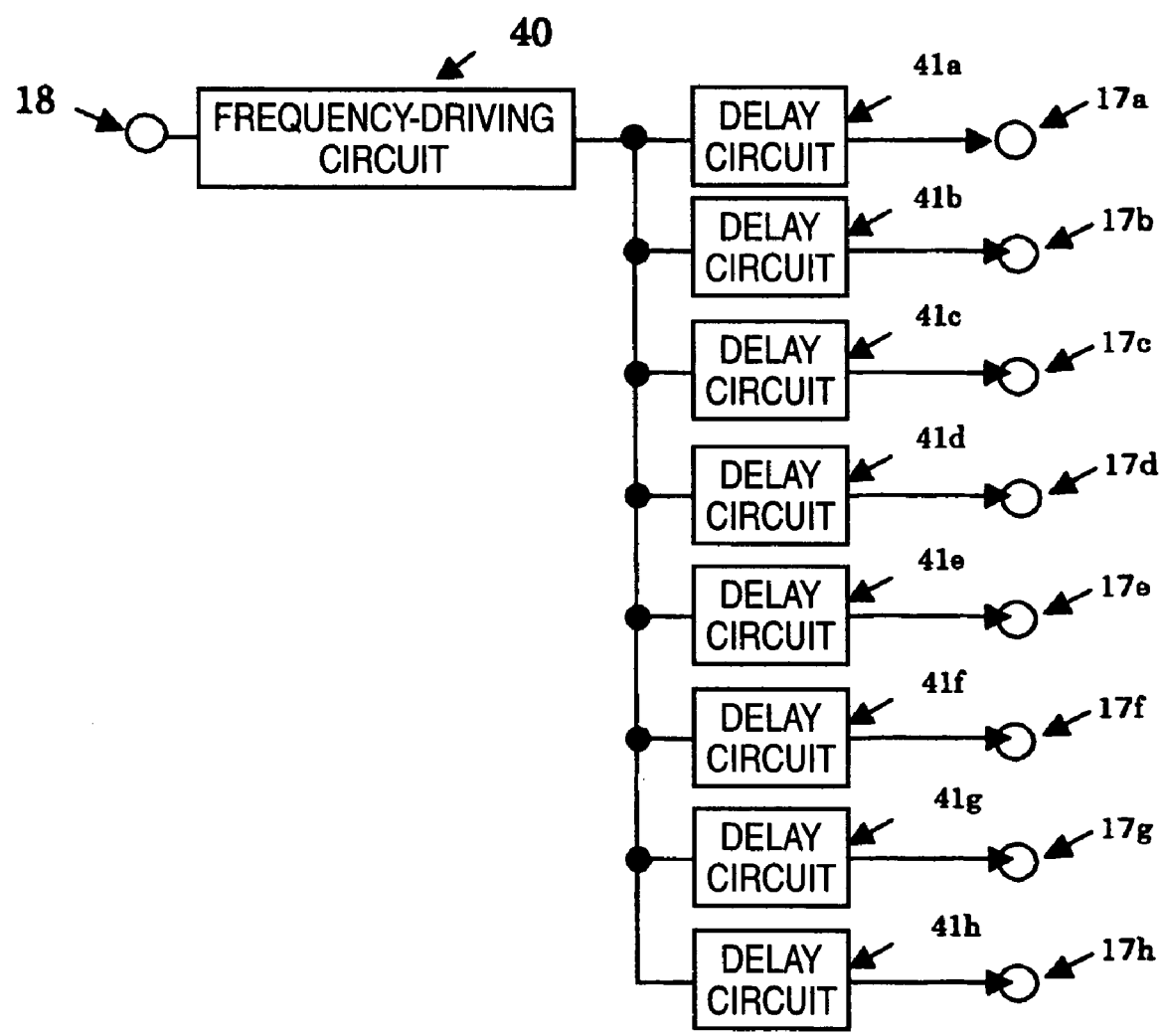
FIG. 3 is a diagram of the configuration of a serial-parallel conversion circuit according to the first embodiment.

FIG. 3 is a diagram of the configuration of the serial-parallel conversion circuit 19 that carries out serial-parallel conversion. A clock signal at a cycle of 2H input to the clock signal input terminal 18 in the serial-parallel conversion circuit 19 for serial-parallel conversion has frequency-divided by four using a frequency-dividing circuit 40, and is sequentially delayed by 1H using a delay circuit 1 at 41a, by 2H using a delay circuit 2 at 41b, by 3H using a delay circuit 3 at 41c, and on. In this way, the waveforms shown in FIG. 2B are obtained at the output terminals for 17a to 17h.

The current values at the current sources 10a to 10h in the constant current circuit 10 are so set that B: A=1: $\sqrt{2}$, and the current values at the current sources 10d and 10h are zero [A].

Figure 4:
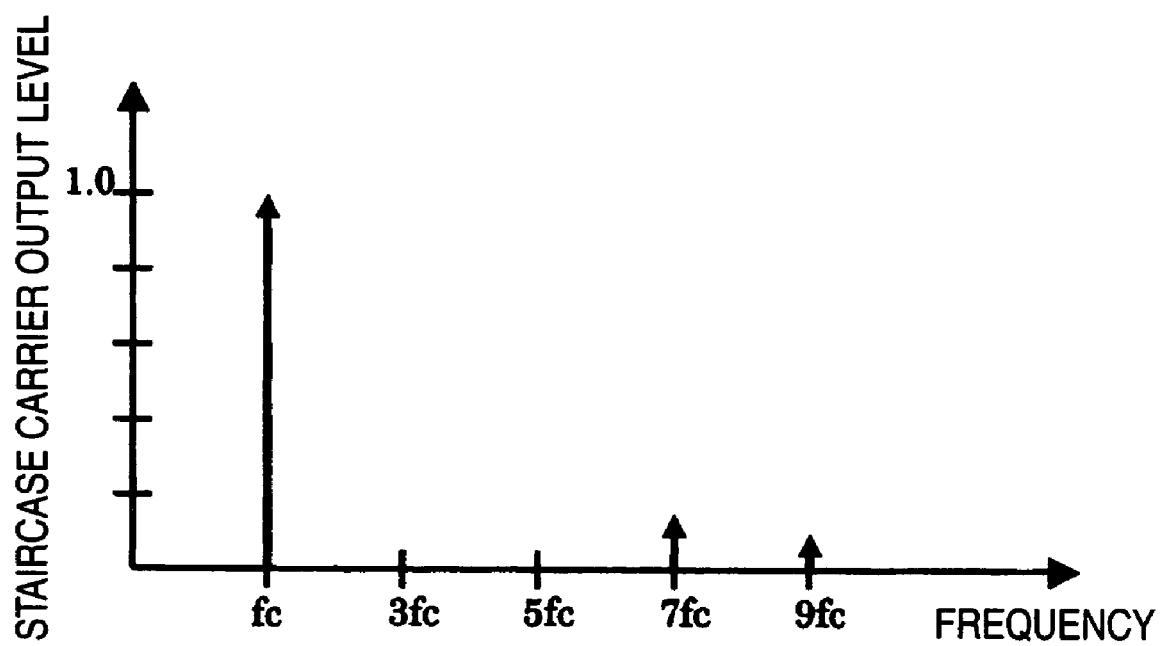
FIG. 4 is a waveform chart showing the frequency components of a staircase wave generated in the staircase generating circuit according to the first embodiment.

The current source signal thus produced is input to the voltage follower circuit 13, and a voltage waveform in a staircase waveform in which the ratio of the peak values from the reference voltage is B: A=1: $\sqrt{2}$ as shown in FIG. 2A is generated at the staircase signal output terminal 15. The frequency component of the generated staircase waveform does not include a 3rd or 5th order high frequency component as shown in FIG. 4.

FIGS. 5 to 8 are charts for staircase waveforms input to the PWM modulation circuit according to the embodiment based on the results of simulations. FIGS. 5A to 8A represent waveforms in the time domain, and FIGS. 5B to 8B represents those in the frequency domain.

Figure 5:
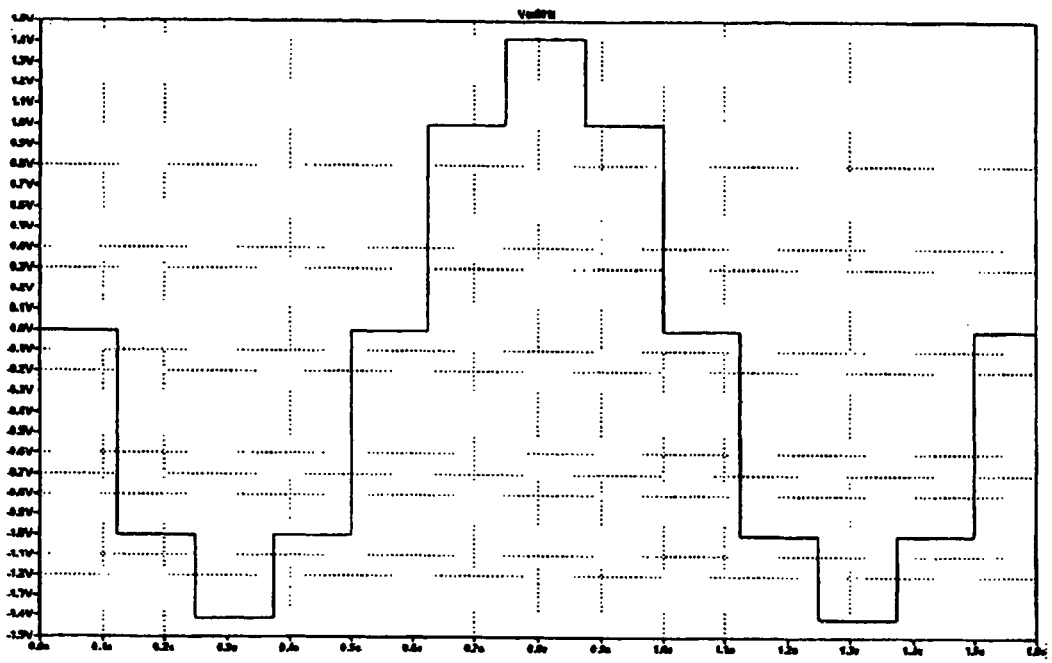
FIG. 5 shows a simulation result for the wave form of a staircase input to a PWM modulation circuit according to the first embodiment when the peak ratio is made of five values, 0: ±1: ±$\sqrt{2}$.
Figure 5:
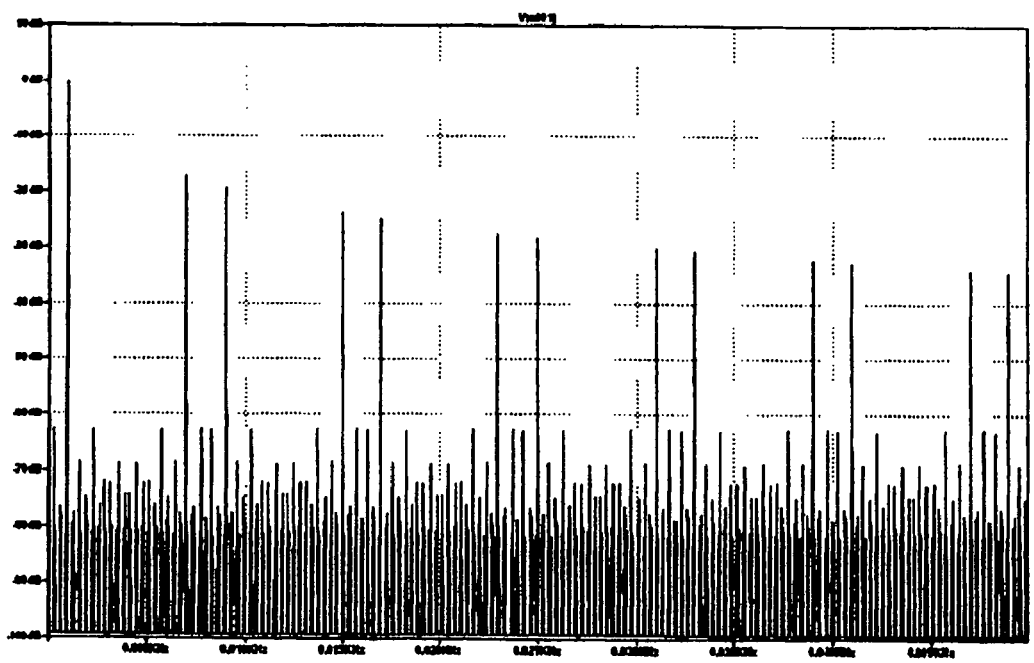

In FIG. 5, the peak values of the staircase waves are set to five values, 0, ±1, and ±$\sqrt{2}$. As compared to the simulation result for the rectangular waveform in FIG. 13, a high frequency component of 3rd order +8×n and 5th order +8×n (n: integer) is reduced by 30 DB or more in the result in FIG. 5.

Figure 6:
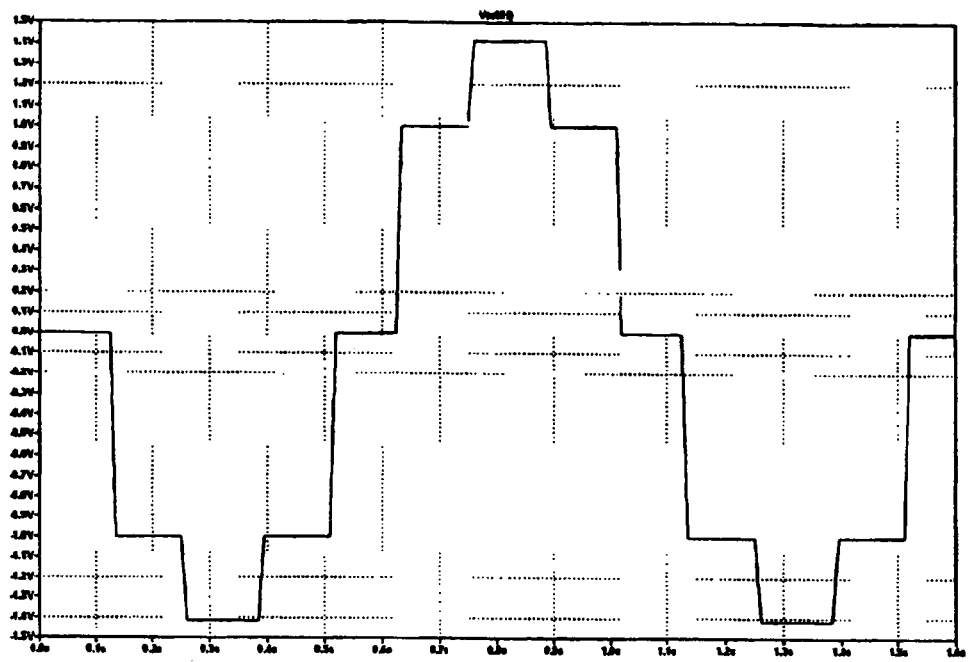
FIG. 6 shows a simulation result for the wave form of a staircase input to the PWM modulation circuit according to the first embodiment when the peak ratio is made of five values, 0: ±1: ±$\sqrt{2}$ and the rising is in delayed timings.
Figure 6:
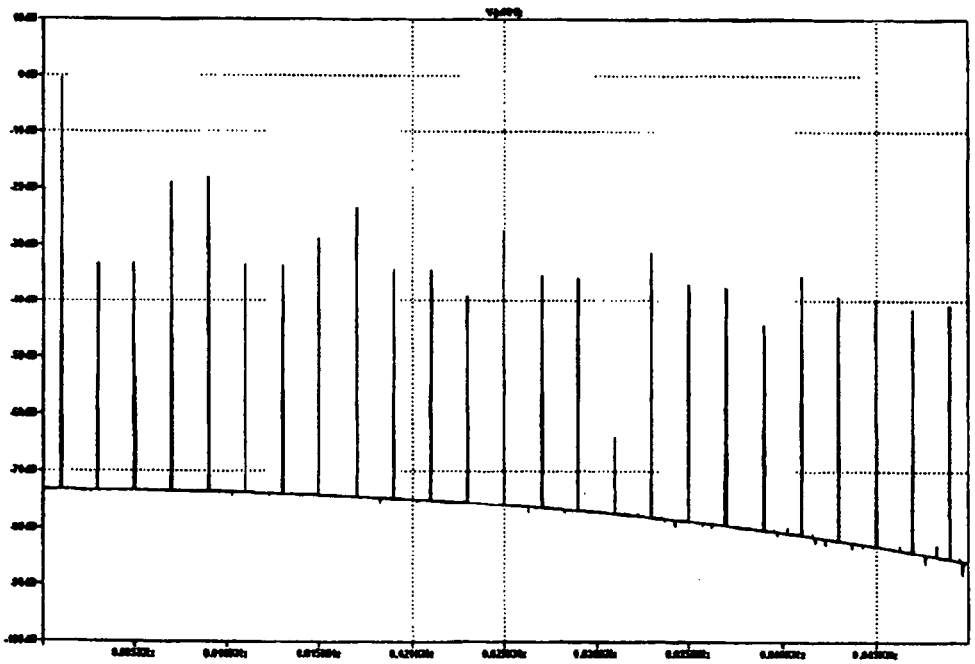

In FIG. 6, the peak values of the staircase wave are set to five values, 0, ±1, and ±$\sqrt{2}$, and the wave is raised in delayed timings. As compared to the simulation result for the rectangular waveforms in FIG. 13, 3rd and 5th order high frequency components are reduced by 15 DB or more in the result in FIG. 6.

Figure 7:
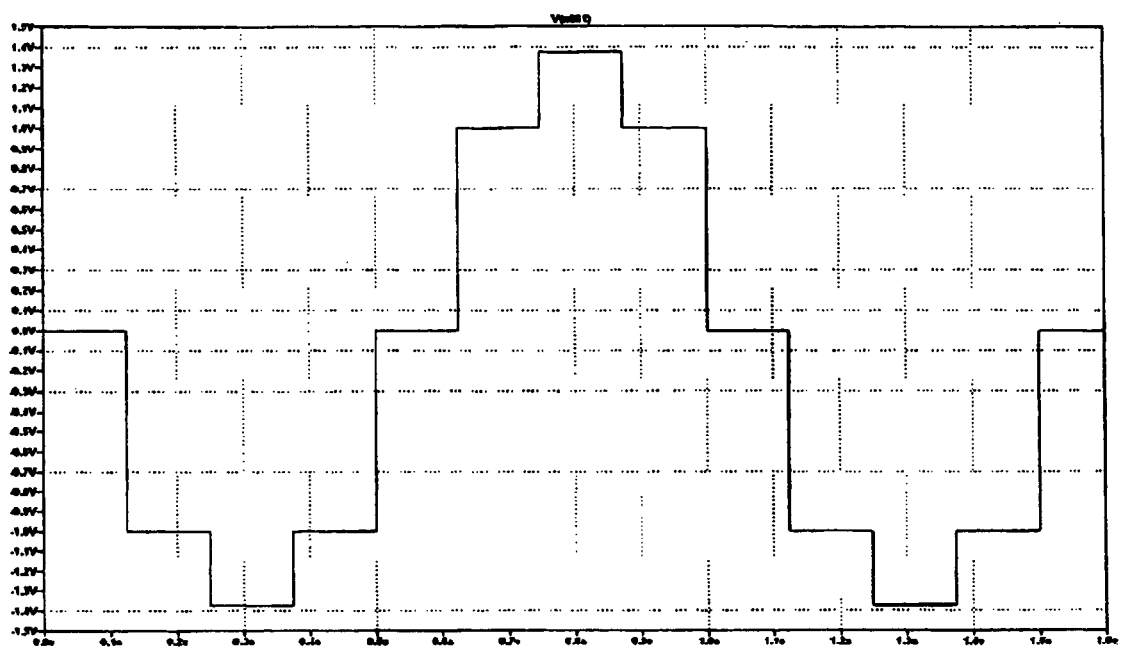
FIG. 7 shows a simulation result for the waveform of a staircase input to the PWM modulation circuit according to the first embodiment when the peak ratio is made of five values, 0: ±1: ±$\sqrt{1.9}$.
Figure 7:
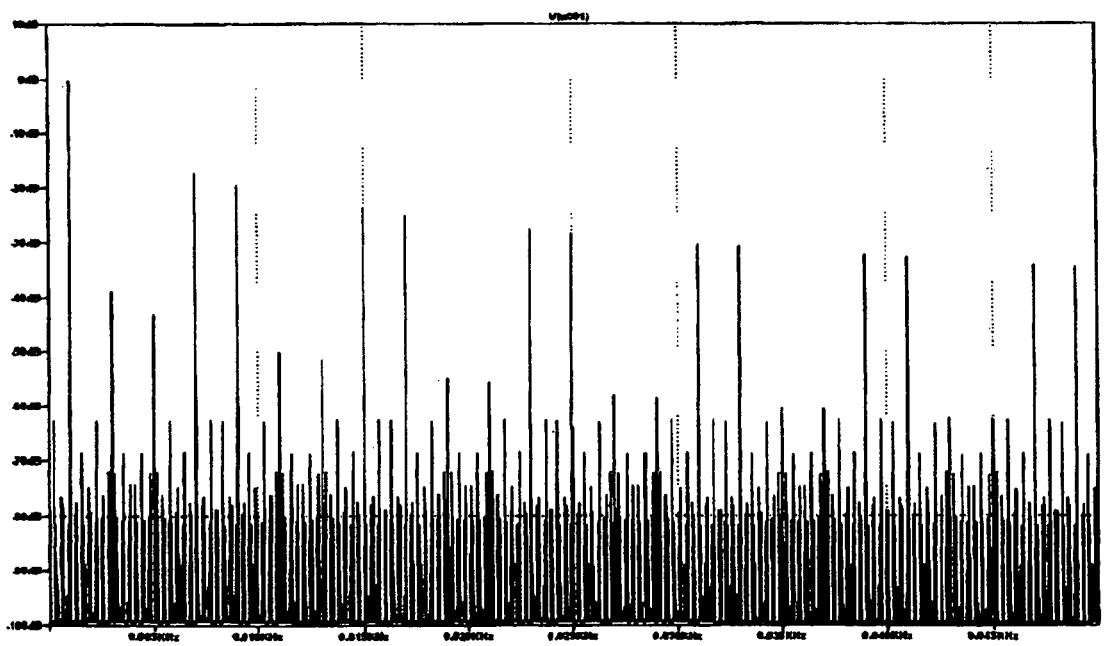

In FIG. 7, the peak values of the staircase wave are set to five values, 0, ±1, and ±$\sqrt{1.9}$. As compared to the simulation result for the rectangular waveform in FIG. 13, 3rd and 5th order high frequency components are reduced by 20 DB or more in the result in FIG. 7.

Figure 8:
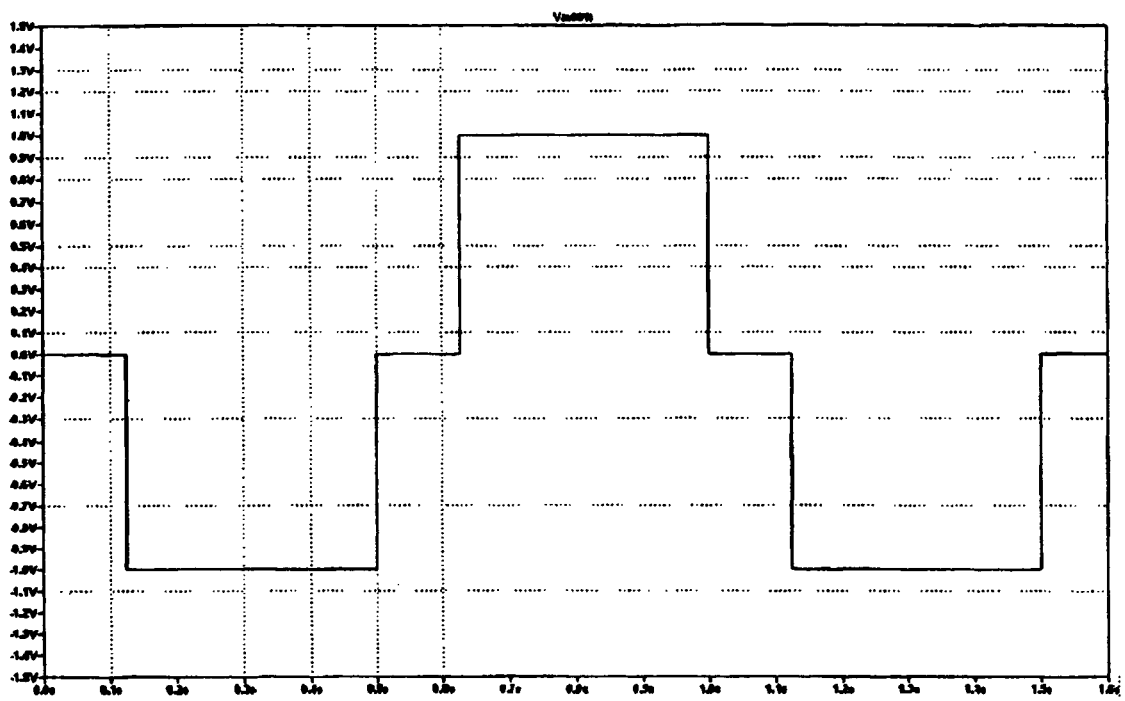
FIG. 8 shows a simulation result for the waveform of a staircase input to the PWM modulation circuit according to the first embodiment when the peak ratio is made of three values, 0: ±1.
Figure 8:
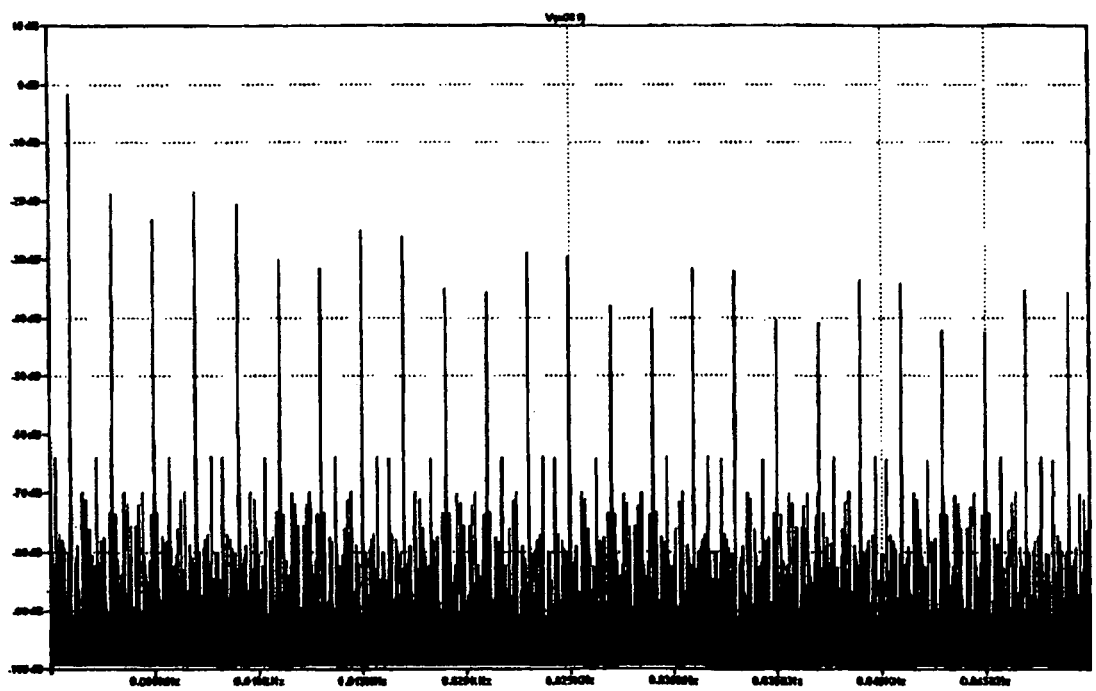

In FIG. 8, the peak values of the staircase wave are set to three values, 0 and ±1. As compared to the simulation result for the rectangular waveform in FIG. 13, 3rd and 5th order high frequency components are reduced by 5 DB or more in the result in FIG. 8.

Such a staircase wave with a small high frequency component is input to the staircase signal input terminal 2 in the PWM modulation circuit 3 and PWM-modulated, and the result is connected to the speaker 5 through the output stage amplifier 4, so that the original signal with a small high frequency component can be restored and output from the speaker.

In this way, according to the first embodiment, a staircase wave having a reduced high frequency component is generated and input to the staircase signal input terminal of the PWM modulation circuit, the staircase wave having the small high frequency component is subjected to PWM modulation, and the modulated signal is amplified by the output stage amplifier, so that the original signal with a reduced high frequency component can be restored and output from the speaker. In this way, the L/C filter can be excluded, the packaging area of the class D amplifier can be kept from increasing and the resulting class D amplifier can have reduced EMI.

Second Embodiment

Figure 9:
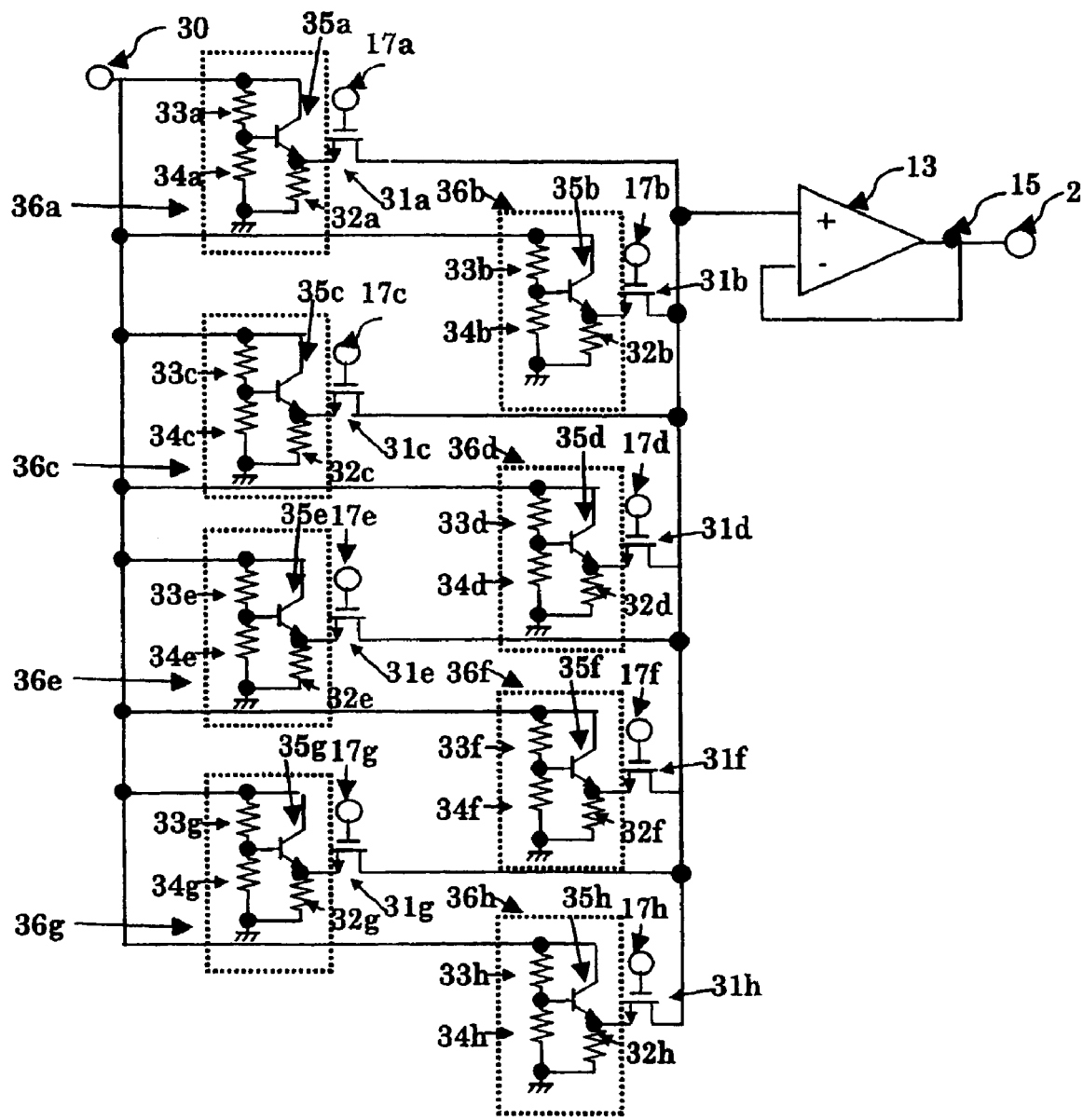
FIG. 9 is a block diagram of the configuration of a staircase generating circuit according to a second embodiment of the invention.

FIG. 9 is a diagram of the configuration of a staircase generating circuit in a class D amplifier having a PWM modulation circuit according to a second embodiment of the invention. The staircase generating circuit according to the second embodiment generating a staircase wave has a different configuration from that according to the first embodiment in that the circuit includes a plurality of constant voltage source circuits 36, and a plurality of voltage source switch circuits 31 instead of the plurality of constant current source circuits 10 and the current source switch circuit 16.

The voltage ratio of the constant voltage at the constant voltage source circuit 36 is 1: $\sqrt{2}$ or a value near the ratio.

The output of the circuit 19 that carries out serial-parallel conversion to a clock signal is connected to the input terminal 17 of the voltage source switch circuit 31, and the voltage source switch circuit 31 has its switch turned on/off in response to the clock signal. The voltage source switch circuit 31 controls the voltage output from the constant voltage source circuit 36 to be transmitted to the input terminal of the voltage follower circuit 13.

In this way, voltage in a staircase waveform in which the ratio of the peak values from the reference voltage is B: A=1: $\sqrt{2}$ as shown in FIG. 2A according to the first embodiment is generated at the staircase signal output terminal 15.

The other configuration is identical to that of the first embodiment, the same elements are denoted by the same reference characters and their description is not repeated.

In this way, according to the second embodiment, when a staircase wave is generated using a constant voltage source circuit, an L/C filter is not necessary as with the first embodiment. Therefore, the packaging area of the class D amplifier can be kept from increasing, and a class D amplifier having reduced EMI can be obtained.

Third Embodiment

Figure 10:
FIG. 10 is a block diagram of the configuration of a staircase generating circuit according to a third embodiment of the invention.
Figure 11:
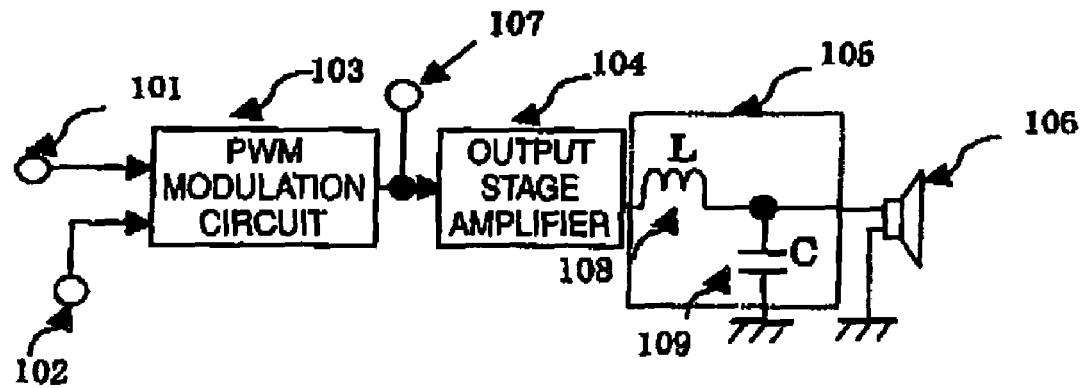
FIG. 11 is a diagram of the configuration of a conventional class D amplifier.
Figure 12:
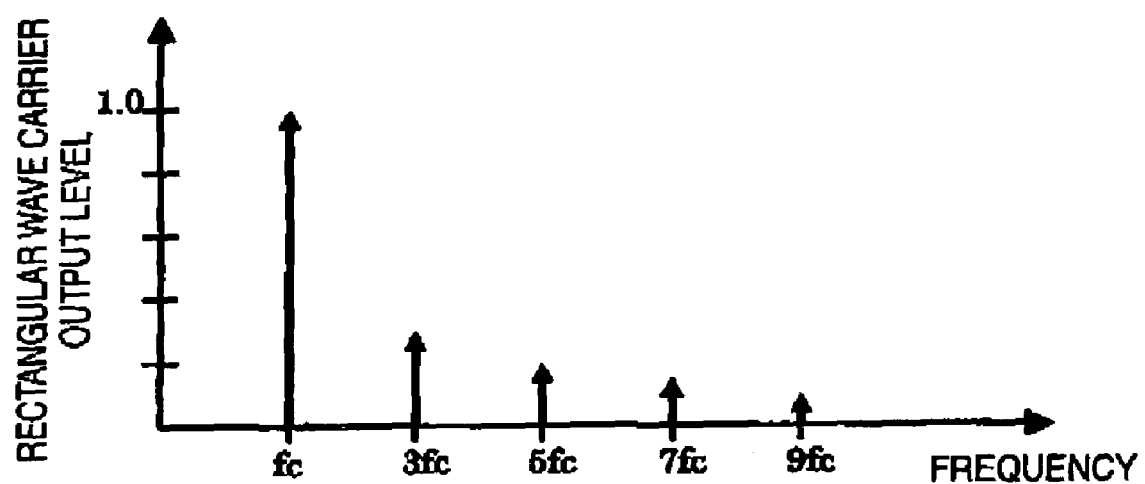
FIG. 12 is a chart showing the characteristic of the frequency components of a rectangular wave.

FIG. 10 is a diagram of the configuration of a staircase generating circuit in a class D amplifier having a PWM modulation circuit according to a third embodiment of the invention. The staircase generating circuit according to the third embodiment generating a staircase wave has a configuration different from that of the first embodiment in that the circuit includes a DC-DC converter circuit 52 that can set a plurality of voltage values and a voltage control circuit 53 for setting the voltage values instead of the plurality of constant current source circuits 10, and the current source switch circuit 16.

The input of the voltage control circuit 53 is variable, and the output of the DC-DC converter circuit 52 is formed into a staircase wave. The output voltage value ratio of the DC-DC converter circuit 52 is 1: $\sqrt{2}$ or a value near the ratio to generate a staircase wave.

The other configuration is identical to that of the first embodiment, the same elements are denoted by the same reference characters, and their description is not repeated.

In this way, according to the third embodiment, when a staircase wave is generated using the DC-DC converter circuit, an L/C filter can be excluded as with the first embodiment. Therefore, the packaging area of the class D amplifier can be kept from increasing, and a class D amplifier having reduced EMI can be obtained.

The PWM modulation circuit and the class D amplifier having the PWM modulation circuit according to the invention allow the packaging area of the class D amplifier to be kept from increasing, and the invention is effectively applicable to a PWM modulation circuit using staircase waves for use in mobile equipment or the like and to a class D amplifier having such a PWM modulation circuit.

What is claimed is:

1. A PWM modulation circuit, connected to an input terminal for an analog baseband signal, and a staircase generating circuit generating a staircase wave, the modulation circuit carrying out PWM modulation to a staircase wave input from the staircase generating circuit based on an analog baseband signal input from the input terminal;

wherein the staircase generating circuit comprises:
a plurality of constant voltage source circuits;
a plurality of switches connected to the plurality of constant voltage source circuits on a one-to-one basis; and
a serial-parallel conversion circuit, carrying out serial-parallel conversion to a clock signal input from a clock signal input terminal and outputs the result to the plurality of switches; and
the plurality of switches switch between their on and off states in response to a clock signal input from the serial-parallel conversion circuit;
the plurality of constant voltage source circuits which are connected to the plurality of switches in an on state, output a constant voltage in a prescribed ratio, so that a staircase wave is generated,
wherein the plurality of constant voltage source circuits comprise:
a DC-DC converter circuit that can output voltages at a plurality of different voltage values in response to the on/off states of the plurality of switches; and
a voltage control circuit that arbitrarily sets the plurality of voltage values, and
in the staircase generating circuit, the DC-DC converter circuit outputs the plurality of voltages based on the voltage value in the prescribed ratio set by the voltage control circuit, so that a staircase wave is generated.

2. The PWM modulation circuit according to claim 1, wherein the serial-parallel conversion circuit comprises:
a frequency-dividing circuit that frequency-divides a clock signal input from the clock signal input terminal and outputs the result; and
a plurality of delay circuits having different delay amounts that delay a signal input from the frequency dividing circuit and output the result, and
the plurality of switches are connected to the plurality of delay circuits on a one-to-one basis.

3. The PWM modulation circuit according to claim 1, wherein as the prescribed ratio, the amplitude ratio of the staircase wave generated by the staircase generating circuit is 1: $\sqrt{2}$ or a value close to the ratio.

4. A class D amplifier, comprising:
the PWM modulation circuit according to claim 1;
an output stage amplifier that amplifies a PWM modulation signal input from the PWM modulation circuit and outputs the result; and
a speaker that outputs the signal input from the output stage amplifier as an audio sound signal.

* * * * *